(12) United States Patent
Dun et al.

(10) Patent No.: US 12,744,446 B2
(45) Date of Patent: Sep. 22, 2026

(54) CHOPPER WITH HIGH SPEED CURRENT SENSOR

(71) Applicant: Delta Electronics (Shanghai) CO., LTD., Shanghai (CN)

(72) Inventors: Xinhuang Dun, Shanghai (CN); Jianfei Zheng, Shanghai (CN); Xiang Luo, Shanghai (CN); Yang Liu, Shanghai (CN); Teng Liu, Shanghai (CN)

(73) Assignee: Delta Electronics (Shanghai) CO., LTD., Shanghai (CN)

( * ) Notice: Subject to any disclaimer, the term of this patent is extended or adjusted under 35 U.S.C. 154(b) by 184 days.

(21) Appl. No.: 18/772,318

(22) Filed: Jul. 15, 2024

(65) Prior Publication Data

US 2025/0088108 A1 Mar. 13, 2025

(30) Foreign Application Priority Data

Sep. 8, 2023 (CN) ........................ 202311166155.8

(51) Int. Cl.
*H02M 1/00* (2007.01)
*G01R 19/00* (2006.01)
*H02M 1/32* (2007.01)

(52) U.S. Cl.
CPC ...... *H02M 1/0009* (2021.05); *G01R 19/0092* (2013.01); *H02M 1/32* (2013.01)

(58) Field of Classification Search
CPC ...... H02M 1/0009; H02M 1/32; H02M 1/322; G01R 19/0092; G01R 19/18
See application file for complete search history.

(56) References Cited

U.S. PATENT DOCUMENTS

2022/0103079 A1* 3/2022 Hariya ............... G01R 19/0092
2023/0253872 A1* 8/2023 Tanaka ............... H02M 1/0009
363/21.02

FOREIGN PATENT DOCUMENTS

CN 103018615 B 4/2015
CN 106849021 A 6/2017
(Continued)

OTHER PUBLICATIONS

R. Cateley, A. Lapthorn and B. Heffernan, "Novel Current-Transformer-Based Current Sensor for High-Bandwidth Measurement of Power Transistor Switching Characteristics," 2025 IEEE 10th Southern Power Electronics Conference (SPEC), Johannesburg, South Africa, 2025 (Year: 2025).*

(Continued)

*Primary Examiner* — Peter M Novak
(74) *Attorney, Agent, or Firm* — Qinghong Xu

(57) ABSTRACT

A converter includes a chopper circuit, including a first resistor and a power switch connected in series; a current detection circuit, including: a first capacitor and an isolation circuit, where an input end of the isolation circuit is connected in series with the first capacitor, an input end of the current detection circuit is connected in parallel to one of the first resistor or the power switch, and the current detection circuit detects a direction of a current flowing through the first capacitor and outputs a current detection signal; a signal conditioning circuit, electrically connected to an output end of the current detection circuit, receiving the current detection signal and outputting a chopper circuit operating state signal; and a controller, electrically connected to the signal conditioning circuit, receiving the chopper circuit operating state signal and determining whether the chopper circuit is in a turned-on state or a turned-off state.

18 Claims, 9 Drawing Sheets

(56) References Cited

FOREIGN PATENT DOCUMENTS

| | | | | |
|---|---|---|---|---|
| CN | 107390079 B | | 1/2020 | |
| CN | 111044772 B | * | 5/2022 | ......... G01R 19/0092 |

OTHER PUBLICATIONS

N. McNeill, N. K. Gupta and W. G. Armstrong, "Active current transformer circuits for low distortion sensing in switched mode power converters," in IEEE Transactions on Power Electronics, vol. 19, No. 4, pp. 908-917, Jul. 2004, (Year: 2004).*
Machine translation of CN 111044772 (Year: 2022).*

* cited by examiner

CHOPPER WITH HIGH SPEED CURRENT SENSOR

CROSS-REFERENCE TO RELATED APPLICATION

The present application claims the benefit of priority to Chinese patent application No. 2023111661558, filed on Sep. 8, 2023, the contents of which are incorporated herein by reference in their entireties for all purposes.

TECHNICAL FIELD

The present disclosure relates to the field of power electronics technology, and in particular to a converter.

BACKGROUND

In devices such as wind power converters, frequency converters, static var generators (SVGs), static synchronous compensators (STATCOMs), and flexible direct current (DC) transmissions, in order to bleed the energy of the DC bus in the event of transient grid overvoltage or energy backflow, a chopper circuit needs to be installed. In high-availability applications, the controller needs to know the operating state of the chopper circuit. Otherwise, the availability of the whole system will be affected if the circuit is damaged due to maloperation or failure to operation of the chopper circuit.

As shown in FIG. 1, which is a circuit known to the inventors, the chopper circuit operating state is determined by detecting the DC bus voltage. The DC bus voltage is detected by using an analog to digital (AD) converter, which is an indirect manner to determine the operating state of the chopper circuit. This scheme has some difficulties in the following aspects.

(1) This scheme has a slow response speed. A reason for the slow response speed is that the state of the chopper circuit needs to be reflected on the DC bus voltage, which requires an integration process of the chopper circuit current on the DC bus capacitor. Another reason is that the DC bus voltage is sampled, and the obtained analog signal needs to be filtered, which may cause a certain delay in the filter. Based on the above reasons, the response speed of the scheme using the DC bus voltage to detect is relatively slow.

(2) This scheme causes the bus voltage to drop. The indirect detection scheme using the DC bus voltage has the limitation of not being capable of accurately determining the chopper circuit operating state.

As shown in FIG. 2, which is another circuit known to the inventors, the chopper circuit operating state is determined by using a current detection device to detect the current of the chopper circuit. Specifically, the current detection device is added to the chopper circuit to determine the operating state of the chopper circuit. This scheme can directly determine the operating state of the chopper circuit, but due to the high DC bus voltage, a current sensor with a relatively high rated current is required, such as a high-current Hall device, which is more costly, with a larger volume, and not easy to be integrated with the drive circuit of the chopper circuit.

It should be illustrated that the information disclosed in the above background section is only used for enhancing the understanding of the background of the present disclosure, and thus may include information that does not constitute prior art known to those ordinary skilled in the art.

SUMMARY

The present disclosure provides a converter.

Other features and advantages of the present disclosure will become apparent through the following detailed description, or will be partially learned through the practice of the present disclosure.

According to an aspect of the present disclosure, a converter is provided. The converter includes:

- a chopper circuit, including a first resistor and a power switch connected in series, where the power switch includes a control end, a first end and a second end;
- a current detection circuit, including:
  - a first capacitor; and
  - an isolation circuit, where an input end of the isolation circuit is connected in series with the first capacitor; where
  - an input end of the current detection circuit is connected in parallel to one of the first resistor or the power switch, and the current detection circuit is configured to detect a direction of a current flowing through the first capacitor and output a current detection signal;
- a signal conditioning circuit, electrically connected to an output end of the current detection circuit, where the signal conditioning circuit is configured to receive the current detection signal and output an operating state signal of the chopper circuit; and
- a controller, electrically connected to the signal conditioning circuit, where the controller is configured to receive the operating state signal and determine whether the chopper circuit is in a turned-on state or a turned-off state.

According to another aspect of the present disclosure, a converter is provided. The converter includes:

- a chopper circuit, including a first resistor and a power switch connected in series, where the power switch includes a control end, a first end and a second end;
- a first current detection circuit, including:
  - a first capacitor; and
  - a first isolation circuit, where an input end of the first isolation circuit is connected in series with the first capacitor; where
  - the first current detection circuit is configured to detect a direction of a current flowing through the first capacitor and output a first current detection signal;
- a second current detection circuit, including:
  - a second capacitor; and
  - a second isolation circuit, where an input end of the second isolation circuit is connected in series with the second capacitor; where
  - the second current detection circuit is configured to detect a direction of a current flowing through the second capacitor and output a second current detection signal; and
  - an input end of the first current detection circuit and an input end of the second current detection circuit are connected in parallel to the first resistor, or the input end of the first current detection circuit and the input end of the second current detection circuit are connected in parallel to the power switch;
- a signal conditioning circuit, electrically connected to an output end of the first current detection circuit and an output end of the second current detection circuit, where the signal conditioning circuit is configured to receive one of the first current detection signal or the second current detection signal, and output an operating state signal of the chopper circuit; and a controller, electrically connected to the signal conditioning circuit, where the controller is configured to receive the operating state signal and determine whether the chopper circuit is in a turned-on state or a turned-off state.

It should be understood that the general description above and the detailed description later are only exemplary and explanatory, and do not limit the present disclosure.

BRIEF DESCRIPTION OF THE DRAWINGS

The accompanying drawings herein are incorporated into and form a part of the specification, illustrate embodiments consistent with the present disclosure, and are used in conjunction with the specification to explain the principles of the present disclosure. Obviously, the accompanying drawings in the following description are only some of the embodiments of the present disclosure, and other accompanying drawings may be obtained based on these drawings by those ordinary skilled in the art without creative labor.

DETAILED DESCRIPTION

Figure 1:
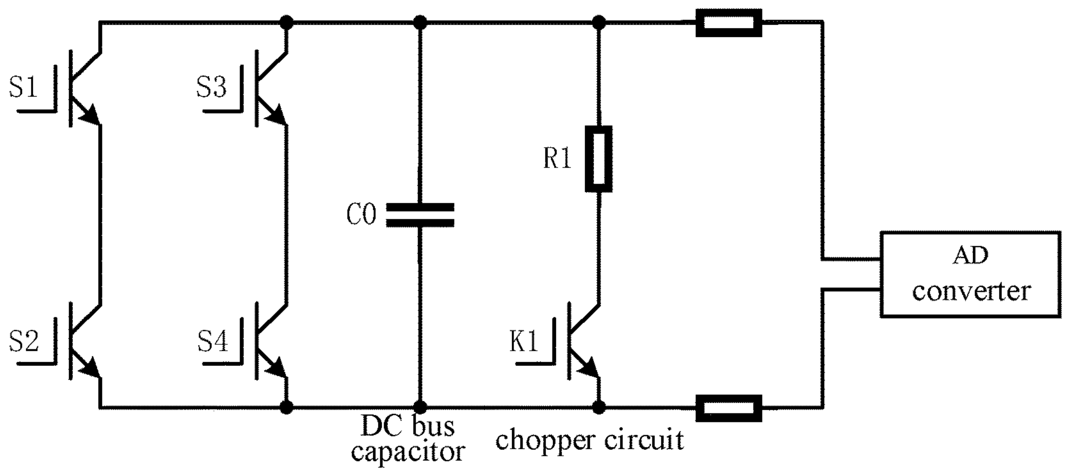
FIG. 1 illustrates a circuit diagram of a circuit known to the inventors.

Example embodiments are now described more comprehensively with reference to the accompanying drawings. However, the example embodiments are capable of being implemented in a variety of forms and should not be construed as being limited to the examples set forth herein. Rather, the provision of these embodiments allows for the present disclosure to be more comprehensive and complete and conveys the idea of the example embodiments in a comprehensive manner to those skilled in the art. The described features, structures, or characteristics may be combined in one or more embodiments in any suitable manner.

In addition, the accompanying drawings are only schematic illustrations of the present disclosure and are not necessarily drawn to scale. The same reference numerals in the drawings indicate the same or similar portions, and thus repetitive descriptions of them will be omitted. Some of the block diagrams shown in the accompanying drawings are functional entities that do not necessarily have to correspond to physically or logically separate entities. These functional entities may be implemented in a software form, or in one or more hardware modules or integrated circuits, or in different networks and/or processor devices and/or microcontroller devices.

The terms "first", "second", . . . , etc. used in the present disclosure are not intended to refer specifically to order or precedence, nor are they intended to limit the present disclosure, but are merely intended to distinguish components or operations described in the same technical terminology. Secondly, the terms "include", "comprise", "have", "contain", etc. used in the present disclosure are all open-ended terms that are meant to include but are not limited to. In addition, "couple" or "connect" used in the present disclosure may refer to two or more components being in direct physical or electrical contact, or in indirect physical or electrical contact with each other. Furthermore, in the present disclosure, "a" and "the" may refer to one or more in general unless there are special restrictions on the article in the context.

The detailed description of the embodiments of the present disclosure is described in detail below in conjunction with the accompanying drawings.

The present disclosure provides a converter that overcomes, at least to a certain extent, the problems of slow response speed, large volume and high cost due to related arts. In the present disclosure, the chopper circuit refers to a circuit structure in which a resistor and a power switch are connected in series, and then are connected in parallel to a DC bus. The power switch may be an insulated gate bipolar transistor (IGBT), a metal-oxide-semiconductor field-effect transistor (MOSFET), or other active switches.

Figure 3:
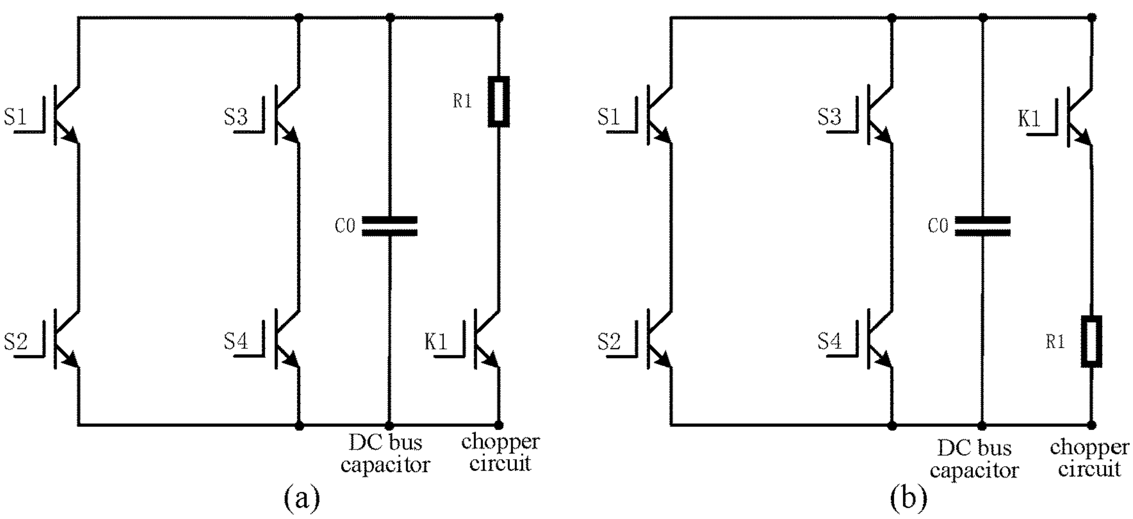
FIG. 3 illustrates a circuit diagram of an H-bridge type converter with two chopper circuit structures.

An H-bridge type converter with two chopper circuit structures is illustrated in (a) and (b) of FIG. 3. A resistor and a power switch on the right side of the intermediate DC bus capacitor form the chopper circuit. In (a) of FIG. 3, an H-bridge type circuit is formed by power devices S1, S2, S3, and S4, a DC bus capacitor C0 is connected in parallel to the DC side of the H-bridge type circuit, a resistor R1 and a power switch K1 are is connected in series, and then are connected in parallel to the DC bus capacitor. In (b) of FIG. 3, an H-bridge type circuit is formed by power devices S1, S2, S3, and S4, a DC bus capacitor C0 is connected in parallel to the DC side of the H-bridge type circuit, a power switch K1 and a resistor R1 are connected in series, and then are connected in parallel to the DC bus capacitor.

The present disclosure provides an embodiment of a converter based on the structure in (a) of FIG. 3. Applying the embodiments of the present disclosure to (b) of FIG. 3 can achieve the same function and effect, and also falls within the scope of protection of the present disclosure.

Figures 4, 5:
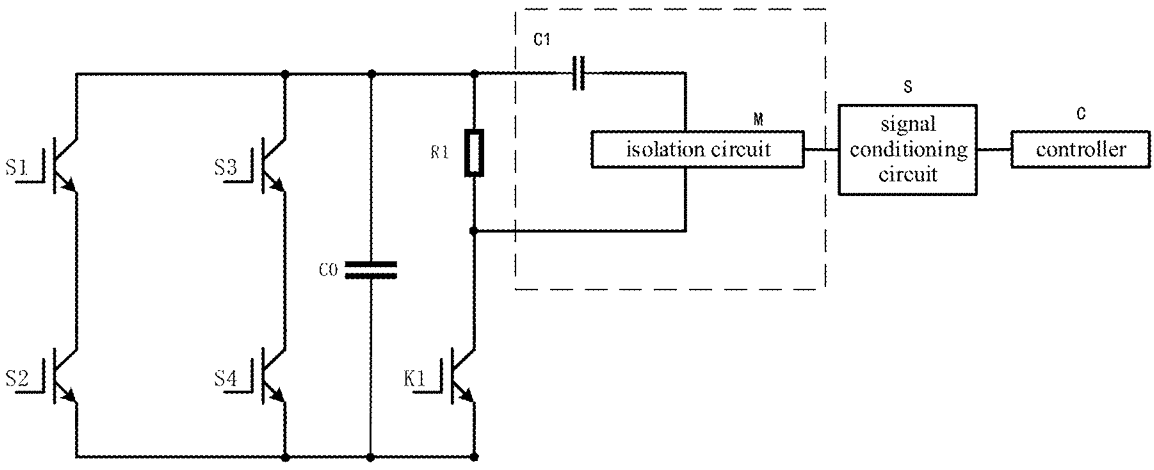
FIG. 4 illustrates a first circuit diagram of a converter in an embodiment of the present disclosure.
FIG. 5 illustrates a second circuit diagram of a converter in an embodiment of the present disclosure.

FIG. 4 illustrates a first circuit diagram of a converter in an embodiment of the present disclosure. FIG. 5 illustrates a second circuit diagram of a converter in an embodiment of the present disclosure. As shown in FIGS. 4 and 5, the converter provided in the embodiment of the present disclosure includes a chopper circuit, a current detection circuit, a signal conditioning circuit S, and a controller C.

The chopper circuit includes a first resistor R1 and a power switch K1 connected in series. The power switch K1 includes a control end, a first end and a second end.

The current detection circuit includes a first capacitor C1 and an isolation circuit M. An input end of the isolation circuit M is connected in series with the first capacitor C1. An input end of the current detection circuit is connected in parallel to the first resistor R1, or the input end of the current detection circuit is connected in parallel to the power switch K1. The current detection circuit detects a direction of a current flowing through the first capacitor C1 and outputs a current detection signal.

The signal conditioning circuit S is electrically connected to an output end of the current detection circuit. The signal conditioning circuit S receives the current detection signal and outputs a chopper circuit operating state signal.

The controller C is electrically connected to the signal conditioning circuit. The controller receives the chopper circuit operating state signal and determines whether the chopper circuit is in a turned-on state or a turned-off state.

In the first circuit diagram of the converter in FIG. 4, the input end of the current detection circuit is connected in parallel to the first resistor R1. In the second circuit diagram of the converter in FIG. 5, the input end of the current detection circuit is connected in parallel to the power switch K1.

When the voltage across the first resistor R1 or the power switch K1 changes, the capacitance current of the first capacitor C1 is caused to change, and the operating state of the chopper circuit cam be determined by detecting the direction of the current flowing through the first capacitor by using the current detection circuit.

When the power switch K1 is turned on, the chopper circuit is in a turned-on state. When the power switch K1 is turned off, the chopper circuit is in a turned-off state.

In some embodiments, the signal conditioning circuit S adopts different circuit forms such as a comparator and a transistor circuit to convert the current detection signal in a form of an analog signal into the chopper circuit operating state signal in a form of a digital signal. There is a corresponding relationship between the output digital signal and the input analog signal, but the corresponding relationship is not unique. The chopper circuit operating state signal output by the signal conditioning circuit S is the first signal and the second signal which are characterized in the form of a high-level value and a low-level value. For example, the first signal is a high-level signal, and the second signal is a low-level signal.

Figures 6, 7:
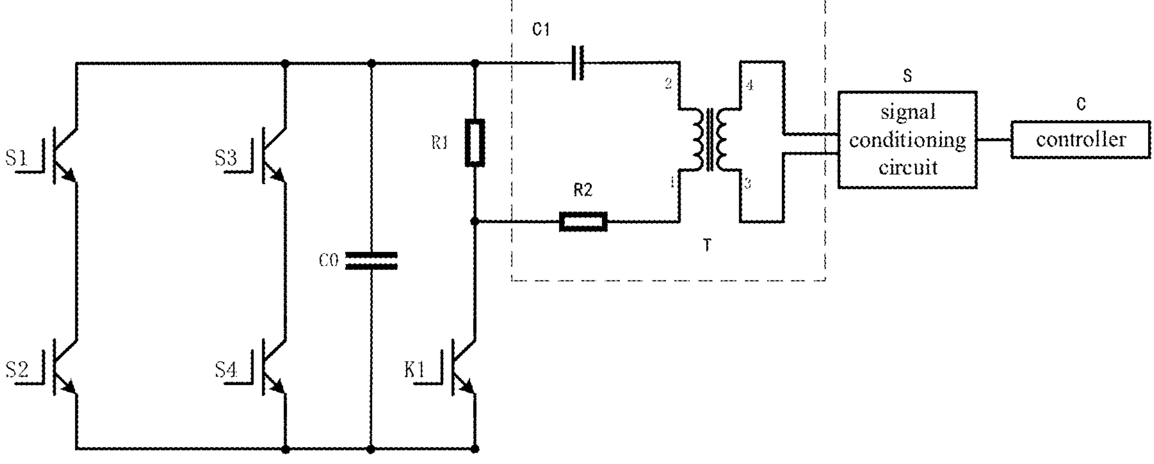
FIG. 6 illustrates a first circuit diagram of a first embodiment of a converter in an embodiment of the present disclosure.
FIG. 7 illustrates a second circuit diagram of a first embodiment of a converter in an embodiment of the present disclosure.

As shown in FIG. 6, a first embodiment of a converter is provided. Referring to the first circuit diagram of the first embodiment, the current detection circuit further includes a second resistor R2 that is connected in series with the first capacitor C1 and the input end of the isolation circuit. The input end of the current detection circuit is connected in parallel to the first resistor R1. The isolation circuit includes a transformer T. A primary side of the transformer T is the input end of the isolation circuit. A secondary side of the transformer is an output end of the isolation circuit.

In this embodiment, the first capacitor C1, the primary side of the transformer T and the second resistor R2 are connected in series, and then are connected in parallel with the first resistor R1, the secondary side of the transformer T is connected to the signal conditioning circuit S, and the signal conditioning circuit S is connected to the controller C.

If the direction of the current of the first capacitor C1 is a first direction, i.e., the capacitance current is from left to right, the first capacitor C1 is charged, and the chopper circuit operating state signal output by the signal conditioning circuit S is the first signal, herein, the first signal is the high-level signal, then the controller C determines that the chopper circuit is in the turned-on state. If the direction of the current of the first capacitor C1 is a second direction, i.e., the capacitance current is from right to left, the first capacitor C1 is discharged, and the chopper circuit operating state signal output by the signal conditioning circuit S is the second signal, herein, the second signal is the low-level signal, then the controller C determines that the chopper circuit is in the turned-off state.

This embodiment uses a set of detection circuits to detect the operating state of the chopper circuit, and the charging and discharging processes of the first capacitor C1 correspond to different operating states of the chopper circuit.

Figure 2:
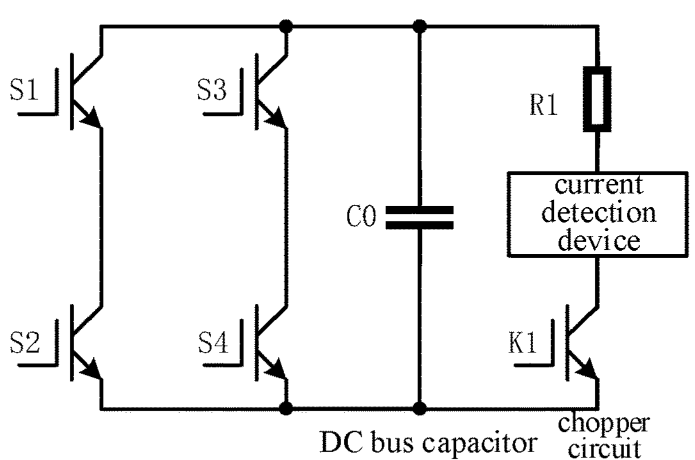
FIG. 2 illustrates a circuit diagram of another circuit known to the inventors.

To achieve a wider coverage, an embodiment of a converter that uses two sets of detection circuits to detect the chopper circuit operating state is also provided to detect both the high voltage condition during normal operation of the DC bus and the module low voltage testing condition during field maintenance. In this way, the cost is slightly increased. Compared to the circuit shown in FIG. 2, a set of detection circuits is about 4% of the cost of the Hall devices, then the cost of two sets of detection circuits increases about 4% relative to the Hall devices of the circuit shown in FIG. 2, which is equivalent to that the cost of two sets of detection circuits is 8% of the cost of the Hall devices of the circuit shown in FIG. 2. This also significantly reduces the cost in essence. Compared to the circuit shown in FIG. 2, it also achieves a smaller volume. This detection manner has a wide operating voltage range and reliable detection signals.

As shown in FIG. 7, a second circuit diagram of the first embodiment of a converter is provided as another circuit connection manner. Compared to the circuit diagram shown in FIG. 6, the input end of the current detection circuit in FIG. 7 is connected in parallel to the power switch K1.

In this embodiment, the first capacitor C1, the primary side of the transformer T, and the second resistor R2 are connected in series and then are connected in parallel with the power switch K1, the secondary side of the transformer T is connected to the signal conditioning circuit S, and the signal conditioning circuit S is connected to the controller C.

If the direction of the current of the first capacitor C1 is the first direction, i.e., the capacitance current is from left to right, the first capacitor C1 is charged, and the chopper circuit operating state signal output by the signal conditioning circuit S is the first signal, herein, the first signal is the high-level signal, then the controller C determines that the chopper circuit is in the turned-off state. If the direction of the current of the first capacitor C1 is the second direction, i.e., the capacitance current is from right to left, the first capacitor C1 is discharged, and the chopper circuit operating state signal output by the signal conditioning circuit S is the second signal, herein, the second signal is the low-level signal, then the controller C determines that the chopper circuit is in the turned-on state.

Figure 8:
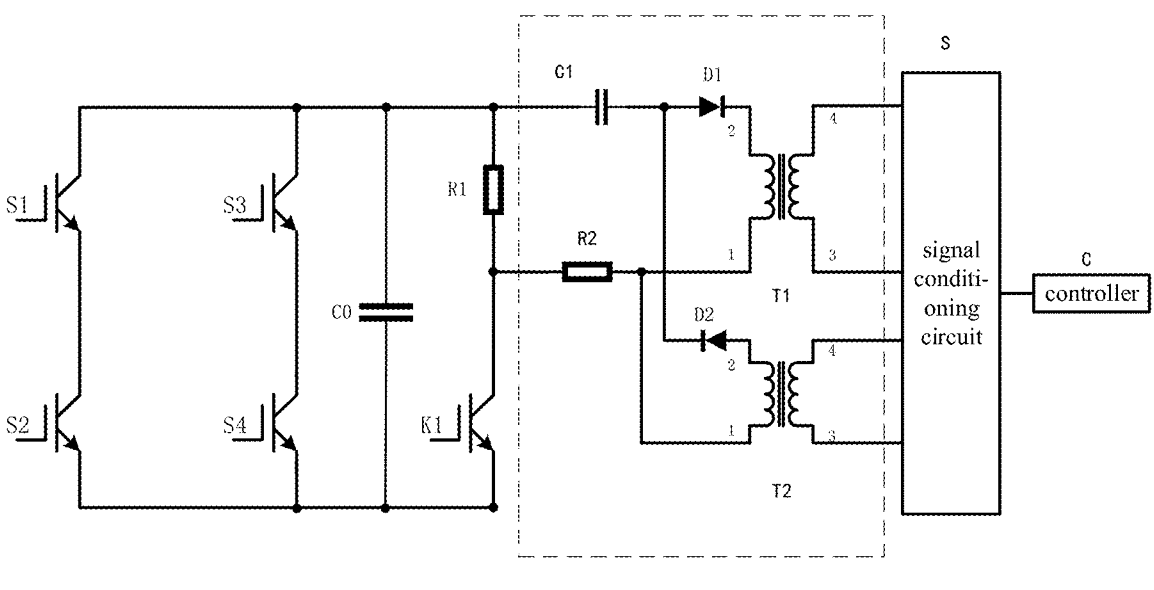
FIG. 8 illustrates a first circuit diagram of a second embodiment of a converter in an embodiment of the present disclosure.

As shown in FIG. 8, a second embodiment of a converter is provided. Referring to the first circuit diagram of the second embodiment, the current detection circuit further includes a second resistor R2, and the isolation circuit M includes a first transformer T1, a second transformer T2, a first diode D1, and a second diode D2.

A primary side of the first transformer T1, the first capacitor C1 and the second resistor R2 are connected in series, and a secondary side of the first transformer T1 is electrically connected to the signal conditioning circuit S.

A primary side of the second transformer T2, the first capacitor C1 and the second resistor R2 are connected in series, the primary side of the second transformer T2 is connected in parallel with the primary side of the first transformer T1, and a secondary side of the second transformer T2 is electrically connected to the signal conditioning circuit S.

A cathode of the first diode D1 is electrically connected to a second end of the primary side of the first transformer T1.

An anode of the second diode D2 is electrically connected to a second end of the primary side of the second transformer T2, a cathode of the second diode D2 is electrically connected to an anode of the first diode D1, and a first end of the second transformer T2 is the same end as a first end of the first transformer T1.

The first capacitor C1, the primary side of the first transformer T1 and the second resistor R2 are connected in series, and then are connected in parallel with the first resistor R1. The first diode D1 is connected between the first capacitor C1 and the primary side of the first transformer T1.

The first capacitor C1, the primary side of the second transformer T2 and the second resistor R2 are connected in series, and then are connected in parallel with the first resistor R1. The second diode D2 is connected between the first capacitor C1 and the primary side of the second transformer T2.

In this embodiment, the current detection signal includes a first current detection signal and a second current detection signal. The first transformer T1 outputs the first current detection signal, and the second transformer T2 outputs the second current detection signal.

In this embodiment, the signal conditioning circuit S includes two signal conditioning subcircuits. The first signal conditioning subcircuit receives the first current detection signal and outputs the chopper circuit operating state signal to the controller. The second signal conditioning subcircuit receives the second current detection signal and outputs the chopper circuit operating state signal to the controller. The controller may determine the turned-on state or turned-off state of the chopper circuit according to the chopper circuit operating state signal output by the first signal conditioning subcircuit or the second signal conditioning subcircuit.

When the direction of the current of the first capacitor C1 is the first direction, i.e., the current of the first capacitor C1 is from left to right, the first capacitor C1 is charged, the first diode D1 is turned on, the first transformer T1 outputs the first current detection signal, the second diode D2 is turned off, the chopper circuit operating state signal output by the signal conditioning circuit S is the first signal, herein, the first signal is the high-level signal, and the controller C determines that the chopper circuit is in the turned-on state.

When the direction of the current of the first capacitor C1 is the second direction, i.e., the current of the first capacitor C1 is from right to left, the first capacitor C1 is discharged, the second diode D2 is turned on, the second transformer T2 outputs the second current detection signal, the first diode D1 is turned off, the chopper circuit operating state signal output by the signal conditioning circuit S is the second signal, herein, the second signal is the high-level signal, and the controller C determines that the chopper circuit is in the turned-off state.

Figure 9:
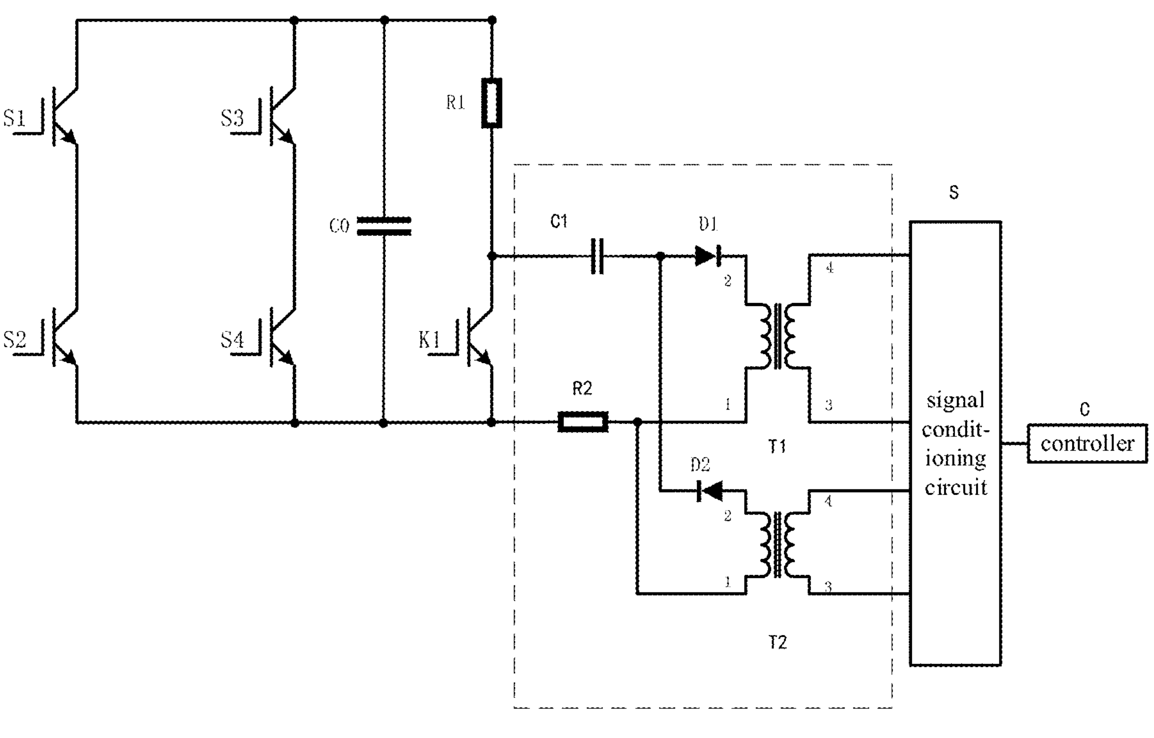
FIG. 9 illustrates a second circuit diagram of a second embodiment of a converter in an embodiment of the present disclosure.

As shown in FIG. 9, a second circuit diagram of the second embodiment of a converter is provided as another circuit connection manner. Compared to the circuit diagram shown in FIG. 8, the input end of the current detection circuit in FIG. 9 is connected in parallel to the power switch K1.

In this embodiment, the current detection circuit further includes a second resistor R2, and the isolation circuit M includes a first transformer T1, a second transformer T2, a first diode D1, and a second diode D2.

A primary side of the first transformer T1, the first capacitor C1 and the second resistor R2 are connected in series, and a secondary side of the first transformer T1 is electrically connected to the signal conditioning circuit S.

A primary side of the second transformer T2, the first capacitor C1 and the second resistor R2 are connected in series, the primary side of the second transformer T2 is connected in parallel with the primary side of the first transformer T1, and a secondary side of the second transformer T2 is electrically connected to the signal conditioning circuit S.

A cathode of the first diode D1 is electrically connected to a second end of the primary side of the first transformer T1.

An anode of the second diode D2 is electrically connected to a second end of the primary side of the second transformer T2, a cathode of the second diode D2 is electrically connected to an anode of the first diode D1, and a first end of the second transformer T2 is the same end as a first end of the first transformer T1.

The first capacitor C1, the primary side of the first transformer T1 and the second resistor R2 are connected in series, and then are connected in parallel with the power switch K1. The first diode D1 is connected between the first capacitor C1 and the primary side of the first transformer T1.

The first capacitor C1, the primary side of the second transformer T2 and the second resistor R2 are connected in series, and then are connected in parallel with the power switch K1. The second diode D2 is connected between the first capacitor C1 and the primary side of the second transformer T2.

In this embodiment, the current detection signal includes a first current detection signal and a second current detection signal. The first transformer T1 outputs the first current detection signal, and the second transformer T2 outputs the second current detection signal.

In this embodiment, the signal conditioning circuit S includes two signal conditioning subcircuits. The first signal conditioning subcircuit receives the first current detection signal and outputs the chopper circuit operating state signal to the controller. The second signal conditioning subcircuit receives the second current detection signal and outputs the chopper circuit operating state signal to the controller. The controller may determine the turned-on state or turned-off state of the chopper circuit according to the chopper circuit operating state signal output by the first signal conditioning subcircuit or the second signal conditioning subcircuit.

When the direction of the current of the first capacitor C1 is the first direction, i.e., the capacitance current is from left to right, the first capacitor C1 is charged, the first diode D1 is turned on, the first transformer T1 outputs the first current detection signal, the second diode D2 is turned off, the chopper circuit operating state signal output by the signal conditioning circuit S is the first signal, herein, the first signal is the high-level signal, and the controller C determines that the chopper circuit is in the turned-off state.

When the direction of the current of the first capacitor C1 is the second direction, i.e., the capacitance current is from right to left, the first capacitor C1 is discharged, the second diode D2 is turned on, the second transformer T2 outputs the second current detection signal, the first diode D1 is turned off, the chopper circuit operating state signal output by the signal conditioning circuit S is the second signal, herein, the second signal is the high-level signal, and the controller C determines that the chopper circuit is in the turned-on state.

Figure 10:
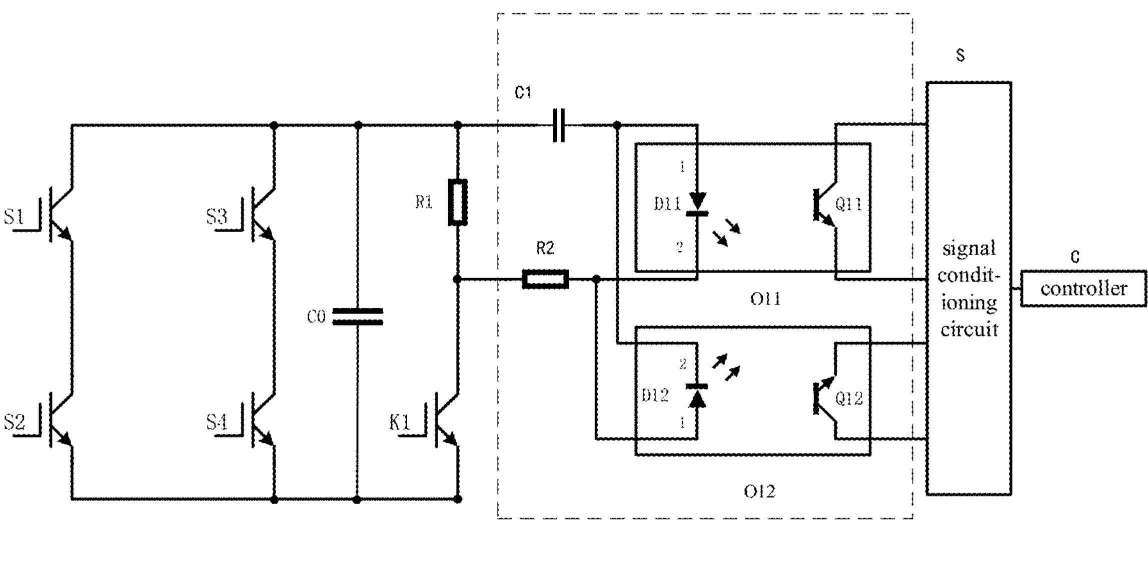
FIG. 10 illustrates a first circuit diagram of a third embodiment of a converter in an embodiment of the present disclosure.

As shown in FIG. 10, a third embodiment of a converter is provided. Referring to the first circuit diagram of the third embodiment, the current detection circuit further includes a second resistor R2, and the isolation circuit includes a first optocoupler device O11 and a second optocoupler device O12.

The first capacitor C1, an input end of the first optocoupler device O11, and the second resistor R2 are connected in series, and an output end of the first optocoupler device O11 is electrically connected to the signal conditioning circuit S.

The first capacitor C1, an input end of the second optocoupler device O12, and the second resistor R2 are connected in series. A first end of the input end of the second optocoupler device O12 is electrically connected to a second end of the input end of the first optocoupler device O11. A second end of the input end of the second optocoupler device O12 is electrically connected to a first end of the input end of the first optocoupler device O11. The first end of the input end of the second optocoupler device O12 has the same polarity as the first end of the input end of the first optocoupler device O11. An output end of the second optocoupler device O12 is electrically connected to the signal conditioning circuit S.

In this embodiment, the first capacitor C1, the input end of the first optocoupler device O11 and the second resistor R2 are connected in series, and then are connected in parallel with the first resistor R1. The input end of the first optocoupler device O11 is a light emitting device D11, and the output end of the first optocoupler device O11 is a photosensitive device Q11.

In this embodiment, the first capacitor C1, the input end of the second optocoupler device O12 and the second resistor R2 are connected in series, and then are connected in parallel with the first resistor R1. The input end of the second optocoupler device O12 is a light emitting device D12, and the output end of the second optocoupler device O12 is a photosensitive device Q12. It is included but not limited to that, the above-described light emitting device D11 and light emitting device D12 may be light emitting diodes, and the above-described photosensitive device Q11 and photosensitive device Q12 may be photosensitive triodes.

The first end of the light emitting device D11 has the same polarity as the first end of the light emitting device D12, for example, they may be anodes. The second end of the light emitting device D11 has the same polarity as the second end of the light emitting device D12, for example, they may be cathodes. The above-described light emitting device D11 and photosensitive device Q11 are set relative to each other in a confined space. The light emitting device D11 emits light when it is forward conducted, and the photosensitive signal generated by the irradiation of the light on the photosensitive device Q11 is used as the current detection signal. The above-described light emitting device D12 and photosensitive device Q12 are set relative to each other in a confined space. The light emitting device D12 emits light when it is forward conducted, and the photosensitive signal generated by the irradiation of the light on the photosensitive device Q12 is used as the current detection signal.

When the direction of the current of the first capacitor C1 is the first direction, i.e., the current of the first capacitor C1 is from left to right, the first capacitor C1 is charged, the light emitting device D11 at the input end of the first optocoupler device O11 is forward conducted and emits light to the photosensitive device Q11, and the photosensitive device Q11 generates a photosensitive signal as the first current detection signal, so the first optocoupler device O11 outputs the first current detection signal, the chopper circuit operating state signal output by the signal conditioning circuit S is the first signal, herein, the first signal is the high-level signal, and the controller C determines that the chopper circuit is in the turned-on state; the light emitting device D12 at the input end of the second optocoupler device O12 is reversely cut off.

When the direction of the current of the first capacitor C1 is the second direction, i.e., the current of the first capacitor C1 is from right to left, the first capacitor C1 is discharged, the light emitting device D12 at the input end of the second optocoupler device O12 is forward conducted and emits light to the photosensitive device Q12, and the photosensitive device Q12 generates a photosensitive signal as the second current detection signal, so the second optocoupler device O12 outputs the second current detection signal, the chopper circuit operating state signal output by the signal conditioning circuit S is the second signal, herein, the second signal is the high-level signal, and the controller C determines that the chopper circuit is in the turned-off state; the light emitting device D11 at the input end of the first optocoupler device O11 is reversely cut off.

In this embodiment, the signal conditioning circuit S includes two signal conditioning subcircuits. The first signal conditioning subcircuit receives the first current detection signal and outputs the chopper circuit operating state signal to the controller. The second signal conditioning subcircuit receives the second current detection signal and outputs the chopper circuit operating state signal to the controller. The controller may determine the turned-on state or turned-off state of the chopper circuit according to the chopper circuit operating state signal output by the first signal conditioning subcircuit or the second signal conditioning subcircuit.

Figure 11:
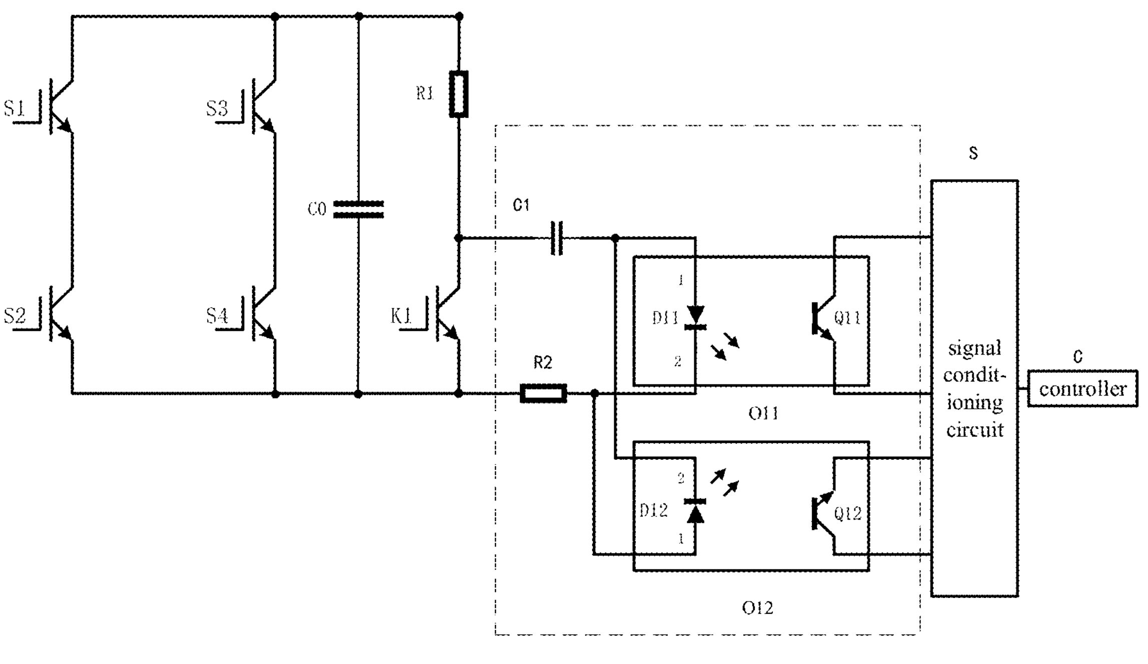
FIG. 11 illustrates a second circuit diagram of a third embodiment of a converter in an embodiment of the present disclosure.

As shown in FIG. 11, a second circuit diagram of the third embodiment of a converter is provided as another circuit connection manner. Compared to the circuit diagram shown in FIG. 10, the input end of the current detection circuit in FIG. 11 is connected in parallel to the power switch K1.

In this embodiment, the current detection circuit further includes a first capacitor C1, a second resistor R2, a first optocoupler device O11, and a second optocoupler device O12.

The first capacitor C1, the input end of the first optocoupler device O11 and the second resistor R2 are connected in series, and then are connected in parallel with the power switch K1. The output end of the first optocoupler device O11 is electrically connected to the signal conditioning circuit S. The input end of the first optocoupler device O11 is the light emitting device D11, and the output end of the first optocoupler device O11 is the photosensitive device Q11.

The first capacitor C1, the input end of the second optocoupler device O12 and the second resistor R2 are connected in series, and then are connected in parallel with the power switch K1. The output end of the second optocoupler device O12 is electrically connected to the signal conditioning circuit S. The input end of the second optocoupler device O12 is the light emitting device D12, and the output end of the second optocoupler device O12 is the photosensitive device Q12. It is included but not limited to that, the above-described light emitting device D11 and light emitting device D12 may be light emitting diodes, and the above-described photosensitive device Q11 and photosensitive device Q12 may be photosensitive triodes.

The first end of the light emitting device D11 has the same polarity as the first end of the light emitting device D12, for example, they may be anodes. The second end of the light emitting device D11 has the same polarity as the second end of the light emitting device D12, for example, they may be cathodes. The above-described light emitting device D11 and photosensitive device Q11 are set relative to each other in a confined space. The light emitting device D11 emits light when it is forward conducted, and the photosensitive signal generated by the irradiation of the light on the photosensitive device Q11 is used as the current detection signal. The above-described light emitting device D12 and photosensitive device Q12 are set relative to each other in a confined space. The light emitting device D12 emits light when it is forward conducted, and the photosensitive signal generated by the irradiation of the light on the photosensitive device Q12 is used as the current detection signal.

When the direction of the current of the first capacitor C1 is the first direction, i.e., the current of the first capacitor C1 is from left to right, the first capacitor C1 is charged, the light emitting device D11 at the input end of the first optocoupler device O11 is forward conducted and emits light to the photosensitive device Q11, and the photosensitive device Q11 generates a photosensitive signal as the first current detection signal, so the first optocoupler device O11 outputs the first current detection signal, the chopper circuit operating state signal output by the signal conditioning circuit S is the first signal, herein, the first signal is the high-level signal, and the controller C determines that the chopper circuit is in the turned-off state; the light emitting device D12 at the input end of the second optocoupler device O12 is reversely cut off.

When the direction of the current of the first capacitor C1 is the second direction, i.e., the current of the first capacitor C1 is from right to left, the first capacitor C1 is discharged, the light emitting device D12 at the input end of the second optocoupler device O12 is forward conducted and emits light to the photosensitive device Q12, and the photosensitive device Q12 generates a photosensitive signal as the second current detection signal, so the second optocoupler device O12 outputs the second current detection signal, the chopper circuit operating state signal output by the signal conditioning circuit S is the second signal, herein, the second signal is the high-level signal, and the controller C determines that the chopper circuit is in the turned-on state; the light emitting device D11 at the input end of the first optocoupler device O11 is reversely cut off.

In this embodiment, the signal conditioning circuit S includes two signal conditioning subcircuits. The first signal conditioning subcircuit receives the first current detection signal and outputs the chopper circuit operating state signal to the controller. The second signal conditioning subcircuit receives the second current detection signal and outputs the chopper circuit operating state signal to the controller. The controller may determine the turned-on state or turned-off state of the chopper circuit according to the chopper circuit operating state signal output by the first signal conditioning subcircuit or the second signal conditioning subcircuit.

Figure 12:
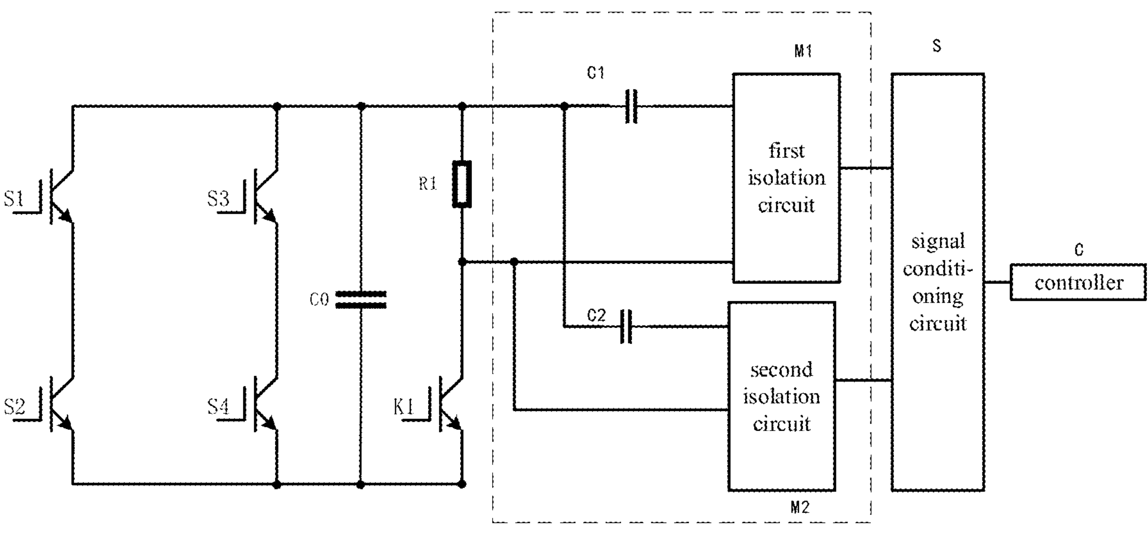
FIG. 12 illustrates a first circuit diagram of a converter in another embodiment of the present disclosure.
Figure 13:
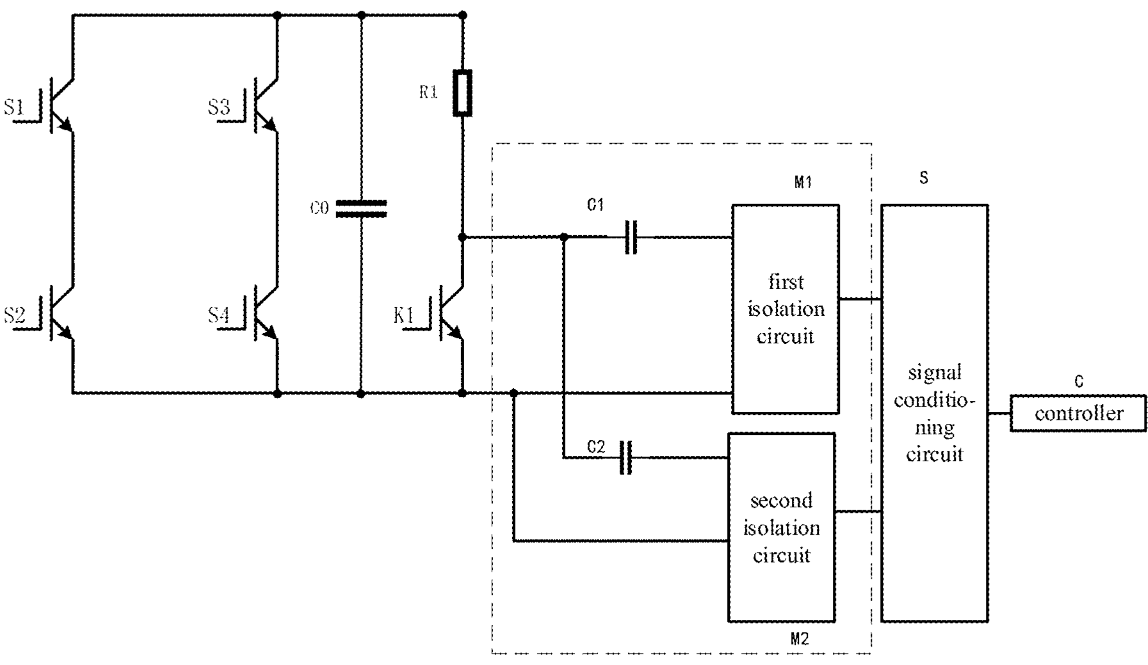
FIG. 13 illustrates a second circuit diagram of a converter in another embodiment of the present disclosure.

FIG. 12 illustrates a first circuit diagram of a converter in another embodiment of the present disclosure. FIG. 13 illustrates a second circuit diagram of a converter in another embodiment of the present disclosure. As shown in FIGS. 12 and 13, the converter provided in another embodiment of the present disclosure includes a chopper circuit, a first current detection circuit, a second current detection circuit, a signal conditioning circuit S, and a controller C.

The chopper circuit includes a first resistor R1 and a power switch K1 connected in series. The power switch K1 includes a control end, a first end and a second end.

The first current detection circuit includes a first capacitor C1 and a first isolation circuit M1. An input end of the first isolation circuit M1 is connected in series with the first capacitor C1. The first current detection circuit detects a direction of a current flowing through the first capacitor C1 and outputs a first current detection signal.

The second current detection circuit includes a second capacitor C2 and a second isolation circuit M2. An input end of the second isolation circuit M2 is connected in series with the second capacitor C2. The second current detection circuit detects a direction of a current flowing through the second capacitor C2 and outputs a second current detection signal.

An input end of the first current detection circuit and an input end of the second current detection circuit are connected in parallel to the first resistor R1, or the input end of the first current detection circuit and the input end of the second current detection circuit are connected in parallel to the power switch K1.

The signal conditioning circuit S is electrically connected to an output end of the first current detection circuit and an output end of the second current detection circuit. The signal conditioning circuit S receives one of the first current detection signal or the second current detection signal, and outputs a chopper circuit operating state signal.

The controller C is electrically connected to the signal conditioning circuit S. The controller C receives the chopper circuit operating state signal and determines whether the chopper circuit is in a turned-on state or a turned-off state.

When the power switch K1 is turned on, the chopper circuit is in the turned-on state. When the power switch K1 is turned off, the chopper circuit is in the turned-off state.

In this embodiment, the signal conditioning circuit S includes two signal conditioning subcircuits. The first signal conditioning subcircuit receives the first current detection signal and outputs the chopper circuit operating state signal to the controller. The second signal conditioning subcircuit receives the second current detection signal and outputs the chopper circuit operating state signal to the controller. The controller may determine the turned-on state or turned-off state of the chopper circuit according to the chopper circuit operating state signal output by the first signal conditioning subcircuit or the second signal conditioning subcircuit.

In the first circuit diagram of the converter in FIG. 12, the input end of the first current detection circuit is connected in parallel to the first resistor R1, and the input end of the second current detection circuit is connected in parallel to the first resistor R1. In the second circuit diagram of the converter in FIG. 13, the input end of the first current detection circuit is connected in parallel to the power switch K1, and the input end of the second current detection circuit is connected in parallel to the power switch K1.

When the voltage across the first resistor R1 or the power switch K1 changes, the capacitance current of the first capacitor C1 and the capacitance current of the second capacitor C2 are caused to change, and the operating state of the chopper circuit can be determined by detecting the direction of the current flowing through the first capacitor C1 by using the first current detection circuit, and by detecting the direction of the current flowing through the second capacitor C2 by using the second current detection circuit.

As shown in FIG. 12, when the input end of the first current detection circuit and the input end of the second current detection circuit are connected in parallel with the first resistor R1, if the direction of the current of the first capacitor C1 is detected to be the first direction, i.e., the current of the first capacitor C1 is from left to right, the first capacitor C1 is charged, then the controller C determines that the chopper circuit is in the turned-on state; if the direction of the current of the second capacitor C2 is detected to be the second direction, i.e., the current of the second capacitor is from right to left, the second capacitor C2 is discharged, then the controller C determines that the chopper circuit is in the turned-off state.

As shown in FIG. 13, when the input end of the first current detection circuit and the input end of the second current detection circuit are connected in parallel with the power switch K1, if the direction of the current of the second capacitor C2 is detected to be the second direction, i.e., the current of the second capacitor C2 is from right to left, the second capacitor C2 is discharged, then the controller C determines that the chopper circuit is in the turned-on state; if the direction of the current of the first capacitor C1 is detected to be the first direction, i.e., the current of the first capacitor C1 is from left to right, the first capacitor C1 is charged, then the controller C determines that the chopper circuit is in the turned-off state.

The signal conditioning circuit S converts the first current detection signal of the current direction of the first capacitor C1 or the second current detection signal of the second capacitor C2 in a form of an analog signal as received into the chopper circuit operating state signal in a form of a digital signal. The chopper circuit operating state signal includes a first signal and a second signal. The first signal corresponds to the first direction, and the second signal corresponds to the second direction.

In this embodiment, the signal conditioning circuit S includes two signal conditioning subcircuits. The first signal conditioning subcircuit receives the first current detection signal and outputs the chopper circuit operating state signal to the controller. The second signal conditioning subcircuit receives the second current detection signal and outputs the chopper circuit operating state signal to the controller. The controller may determine the turned-on state or turned-off state of the chopper circuit according to the chopper circuit operating state signal output by the first signal conditioning subcircuit or the second signal conditioning subcircuit.

Figure 14:
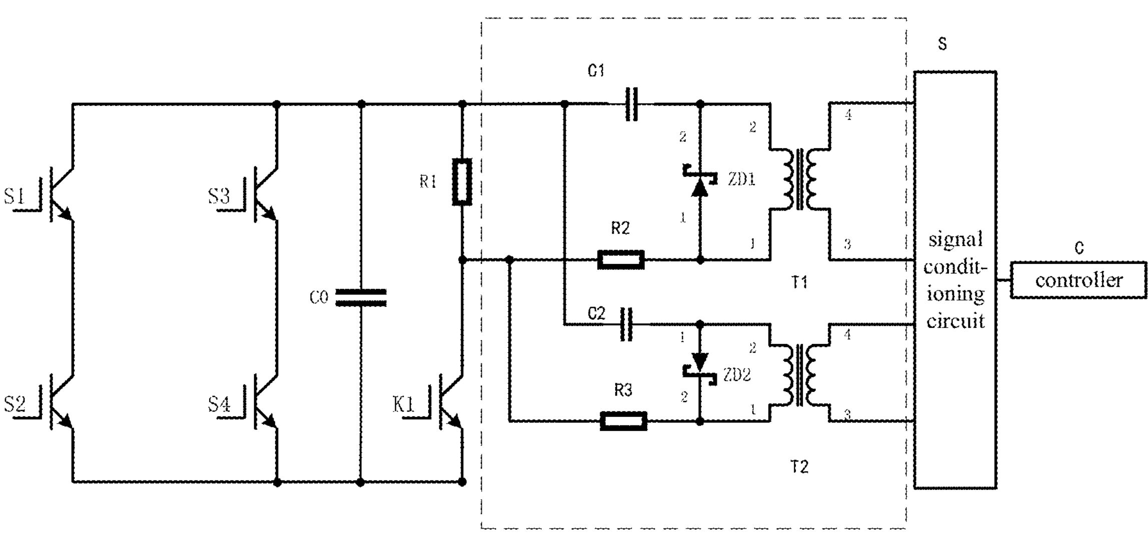
FIG. 14 illustrates a first circuit diagram of a fourth embodiment of a converter in another embodiment of the present disclosure.

As shown in FIG. 14, a fourth embodiment of a converter in another embodiment is provided. Referring to the first circuit diagram of the fourth embodiment, the first current detection circuit further includes a second resistor R2, and the first isolation circuit includes a first transformer T1 and a first voltage regulator tube ZD1. The first capacitor C1, a primary side of the first transformer T1, and the second resistor R2 are connected in series. A secondary side of the first transformer T1 is electrically connected to the signal conditioning circuit S. An anode of the first voltage regulator tube ZD1 is electrically connected to a first end of the primary side of the first transformer T1, and a cathode of the first voltage regulator tube ZD1 is electrically connected to a second end of the primary side of the first transformer T1.

The second current detection circuit further includes a third resistor R3. The second isolation circuit includes a second transformer T2 and a second voltage regulator tube ZD2. The second capacitor C2, a primary side of the second transformer T2, and the third resistor R3 are connected in series. A first end of the primary side of the second transformer T2 is the same end as a first end of the primary side of the first transformer T1. A secondary side of the second transformer T2 is electrically connected to the signal conditioning circuit S. An anode of the second voltage regulator tube ZD2 is electrically connected to a second end of the primary side of the second transformer T2, and a cathode of the second voltage regulator tube ZD2 is electrically connected to the first end of the primary side of the second transformer T2.

In this embodiment, the input end of the first current detection circuit and the input end of the second detection circuit are connected in parallel to the first resistor R1.

Figure 15:
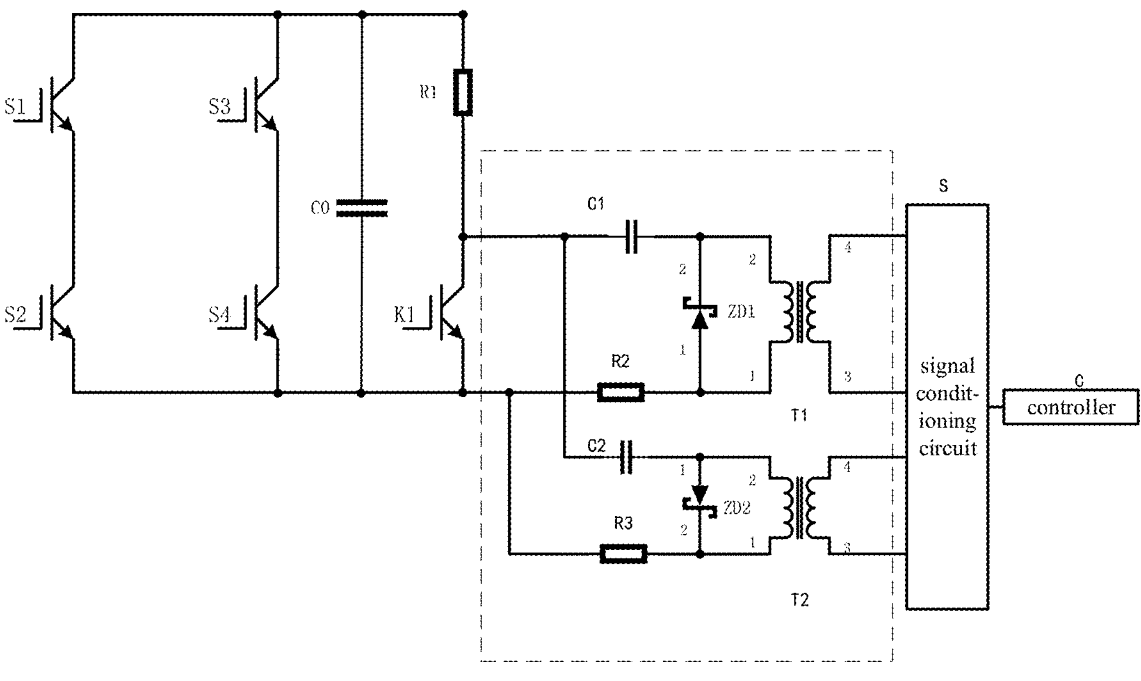
FIG. 15 illustrates a second circuit diagram of a fourth embodiment of a converter in another embodiment of the present disclosure.

As shown in FIG. 15, a second circuit diagram of the fourth embodiment of a converter in another embodiment is provided as another circuit connection manner. Compared to the circuit diagram shown in FIG. 14, the input end of the first current detection circuit and the input end of the second detection circuit are connected in parallel to the power switch K1.

As shown in FIG. 15, in this embodiment, the first capacitor C1, the primary side of the first transformer T1, and the second resistor R2 are connected in series, and then are connected in parallel with the power switch K1. The first voltage regulator tube ZD1 is connected in parallel with the primary side of the first transformer T1. The secondary side of the first transformer T1 is electrically connected to the signal conditioning circuit S. The anode 1 of the first voltage regulator tube ZD1 is electrically connected to the first end of the primary side of the first transformer T1. The cathode 2 of the first voltage regulator tube ZD1 is electrically connected to the second end of the primary side of the first transformer T1. The second capacitor C2, the primary side of the second transformer T2, and the third resistor R3 are connected in series, and then are connected in parallel with the power switch K1. The second voltage regulator tube ZD2 is connected in parallel with the primary side of the second transformer T2. The secondary side of the second transformer T2 is electrically connected to the signal conditioning circuit S. The anode 1 of the second voltage regulator tube ZD2 is electrically connected to the second end of the primary side of the second transformer T2. The cathode 2 of the second voltage regulator tube ZD2 is electrically connected to the first end of the primary side of the second transformer T2.

As in the embodiments shown in FIGS. 14 and 15, the forward bias voltages of the first voltage regulator tube ZD1 and the second voltage regulator tube ZD2 are about 0.3V-0.7V, and the reverse bias voltages of the first voltage regulator tube ZD1 and the second voltage regulator tube ZD2 break down at about 20V.

As shown in FIG. 14, when the direction of the current of the first capacitor C1 and the direction of the current of the second capacitor C2 are the first direction, the capacitance current is from left to right, the first capacitor C1 and the second capacitor C2 are charged, and the primary side of the first transformer T1 has a voltage of about 20V due to the first voltage regulator tube ZD1, which is more than the threshold value set by the signal conditioning circuit S. Therefore, the signal output by the secondary side of the first transformer T1 may be identified by the signal conditioning circuit S. The first transformer T1 outputs the first current detection signal, the chopper circuit operating state signal output by the signal conditioning circuit S is the first signal, herein, the first signal is the high-level signal, and the controller C determines that the chopper circuit is in the turned-on state. The primary side of the second transformer T2 has a voltage of about 0.3V-0.7V due to the forward bias of the second voltage regulator tube ZD2, which is lower than the threshold value set by the signal conditioning circuit S. Therefore, the signal output by the secondary side of the second transformer T2 cannot be identified by the signal conditioning circuit S.

When the direction of the current of the first capacitor C1 and the direction of the current of the second capacitor C2 are the second direction, the capacitance current is from right to left, the first capacitor C1 and the second capacitor C2 are discharged, and the primary side of the second transformer T2 has a voltage of about 20V due to the second voltage regulator tube ZD2, which is more than the threshold value set by the signal conditioning circuit S. Therefore, the signal output by the secondary side of the second transformer T2 may be identified by the signal conditioning circuit S. The second transformer T2 outputs the second current detection signal, the chopper circuit operating state signal output by the signal conditioning circuit S is the second signal, herein, the second signal is the high-level signal, and the controller C determines that the chopper circuit is in the turned-off state. The primary side of the first transformer T1 has a voltage of about 0.3V-0.7V due to the forward bias of the first voltage regulator tube ZD1, which is lower than the threshold value set by the signal conditioning circuit S. Therefore, the signal output by the secondary side of the first transformer T1 cannot be identified by the signal conditioning circuit S.

As shown in FIG. 15, when the direction of the current of the first capacitor C1 and the direction of the current of the second capacitor C2 are the first direction, the capacitance current is from left to right, the first capacitor C1 and the second capacitor C2 are charged, and the primary side of the first transformer T1 has a voltage of about 20V due to the first voltage regulator tube ZD1, which is more than the threshold value set by the signal conditioning circuit S. Therefore, the signal output by the secondary side of the first transformer T1 may be identified by the signal conditioning circuit S. The first transformer T1 outputs the first current detection signal, the chopper circuit operating state signal output by the signal conditioning circuit S is the first signal, herein, the first signal is the high-level signal, and the controller C determines that the chopper circuit is in the turned-off state. The primary side of the second transformer T2 has a voltage of about 0.3V-0.7V due to the forward bias of the second voltage regulator tube ZD2, which is lower than the threshold value set by the signal conditioning circuit S. Therefore, the signal output by the secondary side of the second transformer T2 cannot be identified by the signal conditioning circuit S.

When the direction of the current of the first capacitor C1 and the direction of the current of the second capacitor C2 are the second direction, the capacitance current is from right to left, the first capacitor C1 and the second capacitor C2 are discharged, and the primary side of the second transformer T2 has a voltage of about 20V due to the second voltage regulator tube ZD2, which is more than the threshold value set by the signal conditioning circuit S. Therefore, the signal output by the secondary side of the second transformer T2 may be identified by the signal conditioning circuit S. The second transformer T2 outputs the second current detection signal, the chopper circuit operating state signal output by the signal conditioning circuit S is the second signal, herein, the second signal is the high-level signal, and the controller C determines that the chopper circuit is in the turned-on state. The primary side of the first transformer T1 has a voltage of about 0.3V-0.7V due to the forward bias of the first voltage regulator tube ZD1, which is lower than the threshold value set by the signal conditioning circuit S. Therefore, the signal output by the secondary side of the first transformer T1 cannot be identified by the signal conditioning circuit S.

Figure 16:
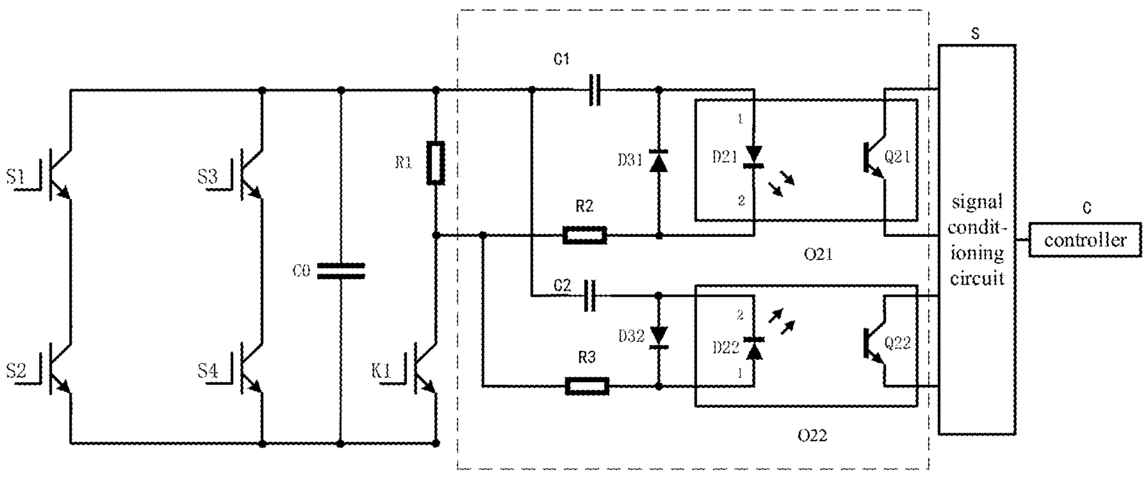
FIG. 16 illustrates a first circuit diagram of a fifth embodiment of a converter in another embodiment of the present disclosure.

As shown in FIG. 16, a fifth embodiment of a converter in another embodiment is provided. Referring to the first circuit diagram of the fifth embodiment, the first current detection circuit further includes a second resistor R2.

The first isolation circuit includes a first optocoupler device O21 and a first diode D31. The first capacitor C1, an input end of the first optocoupler device O21, and the second resistor R2 are connected in series. An output end of the first optocoupler device O21 is electrically connected to the signal conditioning circuit S. A cathode of the first diode D31 is electrically connected to a first end of the input end of the first optocoupler device O21. An anode of the first diode D31 is electrically connected to a second end of the input end of the first optocoupler device O21.

The second current detection circuit further includes a third resistor R3.

The second isolation circuit includes a second optocoupler device O22 and a second diode D32. The second capacitor C2, an input end of the second optocoupler device O22, and the third resistor R3 are connected in series. A first end of the input end of the second optocoupler device O22 is electrically connected to the second end of the input end of the first optocoupler device O21. A second end of the input end of the second optocoupler device O22 is electrically connected to the first end of the input end of the first optocoupler device O21. The first end of the input end of the second optocoupler device O22 has the same polarity as the first end of the input end of the first optocoupler device O21. An output end of the second optocoupler device O22 is electrically connected to the signal conditioning circuit S. An anode of the second diode D32 is electrically connected to the second end of the input end of the second optocoupler device O22. A cathode of the second diode D32 is electrically connected to the first end of the input end of the second optocoupler device O22.

In this embodiment, the input end of the first current detection circuit and the input end of the second detection circuit are connected in parallel to the first resistor R1.

In the first current detection circuit, the first capacitor C1, the input end of the first optocoupler device O21, and the second resistor R2 are connected in series, and then are connected in parallel with the first resistor R1, herein, the input end of the first optocoupler device O21 is a light emitting device D21, and the output end of the first optocoupler device O21 is a photosensitive device Q21.

In the second current detection circuit, the second capacitor C2, the input end of the second optocoupler device O22, and the third resistor R3 are connected in series, and then are connected in parallel with the first resistor R1, herein, the input end of the second optocoupler device O22 is a light emitting device D22, and the output end of the second optocoupler device O22 is a photosensitive device Q22.

The first end of the light emitting device D21 has the same polarity as the first end of the light emitting device D22, for example, they may be anodes. The second end of the light emitting device D21 has the same polarity as the second end of the light emitting device D22, for example, they may be cathodes.

Figure 17:
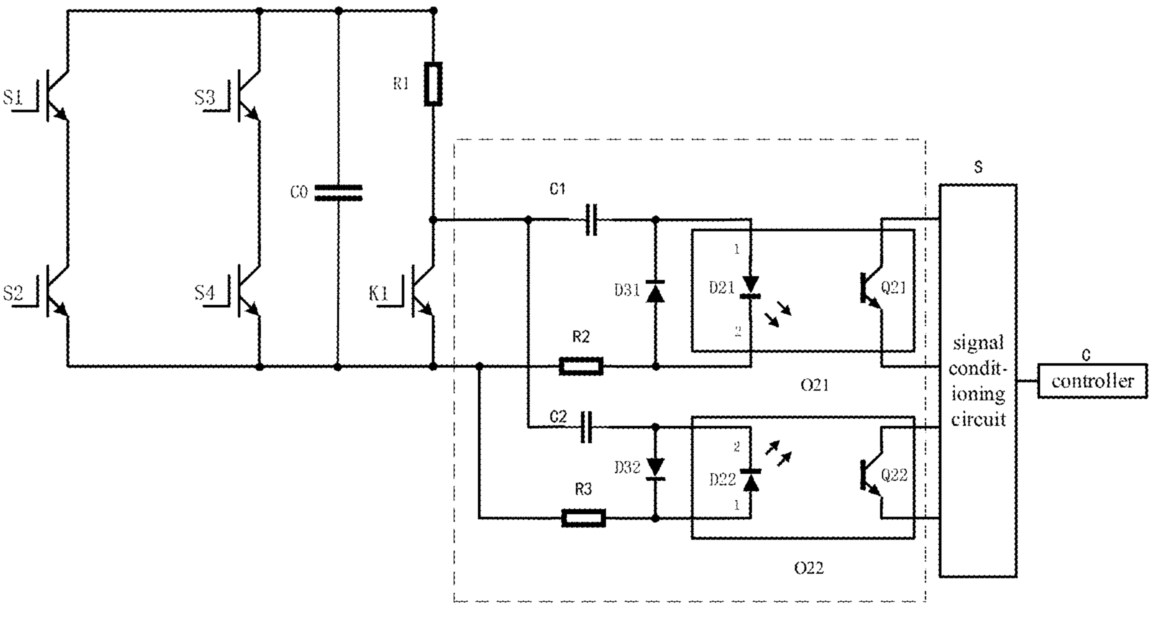
FIG. 17 illustrates a second circuit diagram of a fifth embodiment of a converter in another embodiment of the present disclosure.

As shown in FIG. 17, a second circuit diagram of the fifth embodiment of a converter in another embodiment is provided as another circuit connection manner. Compared to the circuit diagram shown in FIG. 16, the input end of the first current detection circuit and the input end of the second current detection circuit are connected in parallel to the power switch K1.

In the first current detection circuit, the first capacitor C1, the input end of the first optocoupler device O21, and the second resistor R2 are connected in series, and then are connected in parallel with the power switch K1, herein, the input end of the first optocoupler device O21 is the light emitting device D21, and the output end of the first optocoupler device O21 is the photosensitive device Q21.

In the second current detection circuit, the second capacitor C2, the input end of the second optocoupler device O22, and the third resistor R3 are connected in series, and then are connected in parallel with the power switch K1, herein, the input end of the second optocoupler device O22 is the light emitting device D22, and the output end of the second optocoupler device O22 is the photosensitive device Q22.

The first end of the light emitting device D21 has the same polarity as the first end of the light emitting device D22, for example, they may be anodes. The second end of the light emitting device D21 has the same polarity as the second end of the light emitting device D22, for example, they may be cathodes.

As shown in FIG. 16, when the direction of the current of the first capacitor and the direction of the current of the second capacitor are the first direction, the capacitance current is from left to right, the first capacitor C1 and the second capacitor C2 are charged, the light emitting device D21 at the input end of the first optocoupler device O21 is forward conducted and emits light to the photosensitive device Q21, and the photosensitive device Q21 generates a photosensitive signal as the first current detection signal, so the first optocoupler device O21 outputs the first current detection signal, the chopper circuit operating state signal output by the signal conditioning circuit S is the first signal, herein, the first signal is the high-level signal, and the controller C determines that the chopper circuit is in the turned-on state; the light emitting device D22 at the input end of the second optocoupler device O22 is reversely cut off, and the signal output by the photosensitive device Q22 cannot be identified by the signal conditioning circuit S.

When the direction of the current of the first capacitor and the direction of the current of the second capacitor are the second direction, the capacitance current is from right to left, the first capacitor C1 and the second capacitor C2 are discharged, the light emitting device D22 at the input end of the second optocoupler device O22 is forward conducted and emits light to the photosensitive device Q22, and the photosensitive device Q22 generates a photosensitive signal as the second current detection signal, so the second optocoupler device O22 outputs the second current detection signal, the chopper circuit operating state signal output by the signal conditioning circuit S is the second signal, herein, the second signal is the high-level signal, and the controller C determines that the chopper circuit is in the turned-off state. The light emitting device D21 at the input end of the first optocoupler device O21 is reversely cut off, and the signal output by the photosensitive device Q21 cannot be identified by the signal conditioning circuit S.

As shown in FIG. 17, when the direction of the current of the first capacitor and the direction of the current of the second capacitor are the first direction, the capacitance current is from left to right, the first capacitor C1 and the second capacitor C2 are charged, the light emitting device D21 at the input end of the first optocoupler device O21 is forward conducted and emits light to the photosensitive device Q21, and the photosensitive device Q21 generates a photosensitive signal as the first current detection signal, so the first optocoupler device O21 outputs the first current detection signal, the chopper circuit operating state signal output by the signal conditioning circuit S is the first signal, herein, the first signal is the high-level signal, and the controller C determines that the chopper circuit is in the turned-off state; the light emitting device D22 at the input end of the second optocoupler device O22 is reversely cut off, and the signal output by the photosensitive device Q22 cannot be identified by the signal conditioning circuit S.

When the direction of the current of the first capacitor and the direction of the current of the second capacitor are the second direction, the capacitance current is from right to left, the first capacitor C1 and the second capacitor C2 are discharged, the light emitting device D22 at the input end of the second optocoupler device O22 is forward conducted and emits light to the photosensitive device Q22, and the photosensitive device Q22 generates a photosensitive signal as the second current detection signal, so the second optocoupler device O22 outputs the second current detection signal, the chopper circuit operating state signal output by the signal conditioning circuit S is the second signal, herein, the second signal is the high-level signal, and the controller C determines that the chopper circuit is in the turned-on state. The light emitting device D21 at the input end of the first optocoupler device O21 is reversely cut off, and the signal output by the photosensitive device Q21 cannot be identified by the signal conditioning circuit S.

Taking a STATCOM project as an example, the design goal of the system availability is 99%, and the transient overvoltage is 2.0 pu 50 ms. In order to reduce the cost and volume, the selected first resistor R1 of the chopper circuit does not have a large margin of resistance to thermal shock. Because the action frequency of the chopper circuit may be high, the detection of the operating state of the chopper circuit needs to be completed in a short period of time. The range of the bus voltage is wide, the bus voltage in normal operation is about 1000V, and it is not only necessary to detect the operating state of the chopper circuit during normal operation, but also necessary to detect the operating state of the chopper circuit during shutdown and self-test (DC bus voltage of 24V).

Figure 18:
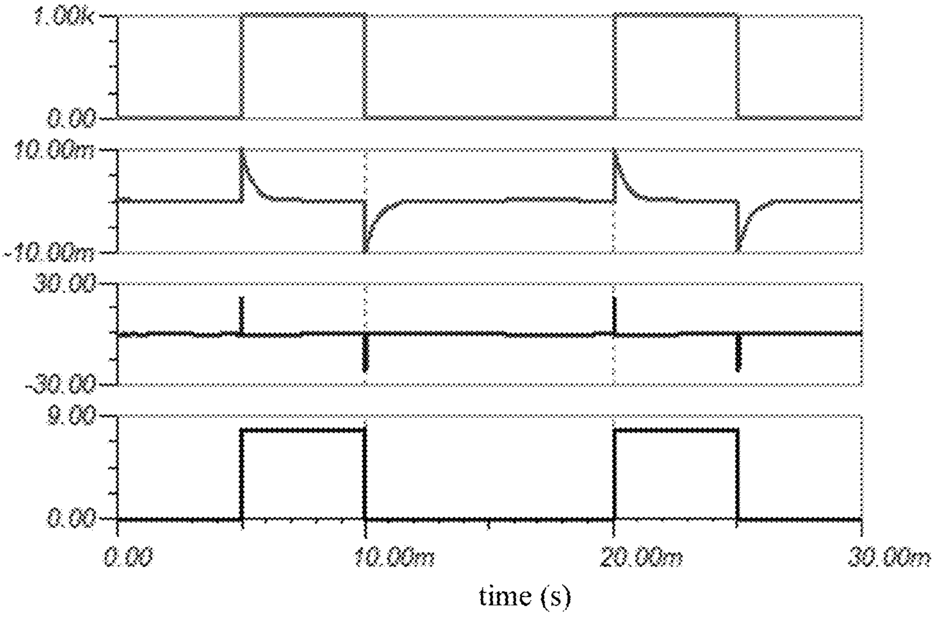
FIG. 18 illustrates a schematic diagram of a first simulation result of a converter in an embodiment of the present disclosure.

In an example, the DC bus voltage Vdc_bus=1000V is used for simulation, and the converter shown in FIG. 6 or FIG. 7 provided in the present disclosure is used for detecting the operating state of the chopper circuit. As shown in FIG. 18, in order from the top to the bottom, the circuit simulation waveforms are: the voltage of the first resistor of the chopper circuit, the current of the first capacitor, the output voltage of the secondary side of the transformer, and the output of the signal conditioning circuit. From FIG. 18, it can be concluded that the output of the signal conditioning circuit can very accurately determine the operating state of the chopper circuit, the chopper circuit state signal in 5-10 ms and 20-25 ms is the high-level signal, indicating that the chopper circuit is in the turned-on state, and in other times the chopper circuit is in the turned-off state.

Figure 19:
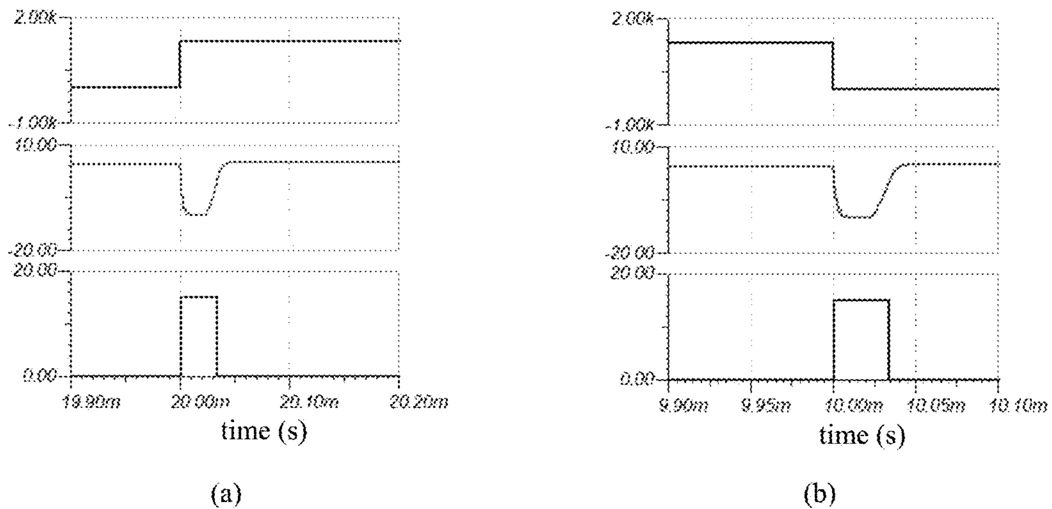
FIG. 19 illustrates a schematic diagram of a second simulation result of a converter in an embodiment of the present disclosure.

In another example, the DC bus voltage Vdc_bus=1300V is used for simulation, and the converter shown in FIG. 14 or FIG. 15 provided in the present disclosure is used for detecting the operating state of the chopper circuit. As shown in FIG. 19, (a) represents the first current detection circuit, and (b) represents the second current detection circuit. In order from the top to the bottom, the circuit simulation waveforms are: the voltage of the first resistor of the chopper circuit, the input of the signal conditioning circuit, and the output of the signal conditioning circuit. From (a) of FIG. 19, it can be concluded that the chopper circuit state signal output by the signal conditioning circuit is the first signal, and the first signal is the high-level signal. From (b) of FIG. 19, it can be concluded that the chopper circuit state signal output by the signal conditioning circuit is the second signal, and the second signal is the high-level signal. Through the observation of the output signal of the signal conditioning circuit, the operating state of the chopper circuit can be determined very accurately.

The converter provided by the present disclosure can be applied to, for example, new energy power generation devices, high and low voltage reactive power compensation devices, and grid power balancing devices such as energy storage, etc., which can withstand short-term severe fluctuations of the power grid. For another example, the converter provided by the present disclosure can be applied to, a device that can withstand short-term energy backflow and an uncontrolled rectifier type frequency converter.

The present disclosure provides a detection device, with a capacitor, connected in parallel across the resistor or power device of the chopper circuit. By detecting the current of the capacitor, the working state of the chopper circuit is determined. The manner of detecting the current of the parallel capacitor has a fast response speed and low cost.

The converter of the present disclosure determines that the chopper circuit is in the turned-on state or the turned-off state by detecting the direction of the current flowing through the first capacitor. Since the voltage across the first resistor or the power switch changes when the chopper circuit is in a different operating state or when the operating state of the chopper circuit changes, the current detection circuit is connected in parallel to the first resistor or the power switch of the chopper circuit, so that the current of the first capacitor may be caused to change when the voltage changes, the direction of the current flowing through the first capacitor is detected by the current detection circuit, and the controller determines that the chopper circuit is in the turned-on state or the turned-off state. Compared to the circuit shown in FIG. 1, the circuit of the present disclosure has a faster response speed and can clearly distinguish the operating state of the chopper circuit. Compared to the circuit shown in FIG. 2, the converter of the present disclosure has a simple structure, does not require an auxiliary voltage, does not require an active device, can achieve isolation and lower cost, has a smaller volume, and is easy to be integrated with the drive circuit of the chopper circuit. By detecting the operating state of the chopper circuit, the present disclosure can know the cause of the fault and prevent the accident from expanding in the case of an abnormal operating state of the chopper circuit.

It should be noted that the acquisition, storage, use, and processing of the data in the technical solution of the present disclosure are in accordance with relevant provisions of national laws and regulations, and various types of data such as personal identity data, operation data, and behavioral data related to individuals, customers, and groups of people, etc. acquired in the embodiments of the present disclosure have been authorized.

Those skilled in the art will easily come up with other embodiments of the present disclosure after considering the specification and practicing the present disclosure herein. The present disclosure aims to cover any variations, uses, or adaptive changes of the present disclosure, which follow the general principles of the present disclosure and include common knowledge or customary technical means in this technology field that are not disclosed in the present disclosure. The specification and embodiments are only considered exemplary, and the true scope and spirit of the present disclosure are indicated by the accompanying claims.

What is claimed is:

1. A converter, comprising:

a chopper circuit, comprising a first resistor and a power switch connected in series, wherein the power switch comprises a control end, a first end and a second end;

a current detection circuit, comprising:

a first capacitor; and an isolation circuit, wherein an input end of the isolation circuit is connected in series with the first capacitor; wherein an input end of the current detection circuit is connected in parallel to one of the first resistor or the power switch, and the current detection circuit is configured to detect a direction of a current flowing through the first capacitor and output a current detection signal;

a signal conditioning circuit, electrically connected to an output end of the current detection circuit, wherein the signal conditioning circuit is configured to receive the current detection signal and output an operating state signal of the chopper circuit; and a controller, electrically connected to the signal conditioning circuit, wherein the controller is configured to receive the operating state signal and determine whether the chopper circuit is in a turned-on state or a turned-off state.

2. The converter according to claim 1, wherein the current detection circuit further comprises a second resistor connected in series with the first capacitor and the input end of the isolation circuit; and the isolation circuit comprises a transformer, wherein a primary side of the transformer is the input end of the isolation circuit, a secondary side of the transformer is an output end of the isolation circuit, and the secondary side of the transformer outputs the current detection signal.

3. The converter according to claim 2, wherein when the input end of the current detection circuit is connected in parallel with the first resistor, the controller determines that the chopper circuit is in the turned-on state in response to the direction of the current of the first capacitor being detected to be a first direction, and the controller determines that the chopper circuit is in the turned-off state in response to the direction of the current of the first capacitor being detected to be a second direction;

when the input end of the current detection circuit is connected in parallel with the power switch, the controller determines that the chopper circuit is in the turned-on state in response to the direction of the current of the first capacitor being detected to be the second direction, and the controller determines that the chopper circuit is in the turned-off state in response to the direction of the current of the first capacitor being detected to be the first direction; and the first direction is opposite to the second direction.

4. The converter according to claim 3, wherein the signal conditioning circuit converts the current detection signal in a form of an analog signal as received into the operating state signal in a form of a digital signal, and the operating state signal comprises a first signal and a second signal, wherein the first signal corresponds to the first direction, and the second signal corresponds to the second direction.

5. The converter according to claim 1, wherein the current detection circuit further comprises a second resistor; and the isolation circuit comprises:

a first transformer, wherein the first capacitor, a primary side of the first transformer and the second resistor are connected in series, and a secondary side of the first transformer is electrically connected to the signal conditioning circuit;

a second transformer, wherein the first capacitor, a primary side of the second transformer and the second resistor are connected in series, the primary side of the second transformer is connected in parallel with the primary side of the first transformer, and a secondary side of the second transformer is electrically connected to the signal conditioning circuit;

a first diode, wherein a cathode of the first diode is electrically connected to a second end of the primary side of the first transformer; and a second diode, wherein an anode of the second diode is electrically connected to a second end of the primary side of the second transformer, a cathode of the second diode is electrically connected to an anode of the first diode, and a first end of the second transformer is a same end as a first end of the first transformer.

6. The converter according to claim 5, wherein the current detection signal comprises a first current detection signal and a second current detection signal, the first transformer outputs the first current detection signal when the direction of the current of the first capacitor is a first direction, and the second transformer outputs the second current detection signal when the direction of the current of the first capacitor is a second direction.

7. The converter according to claim 6, wherein when the input end of the current detection circuit is connected in parallel with the first resistor, the controller determines that the chopper circuit is in the turned-on state in response to the direction of the current of the first capacitor being detected to be the first direction, and the controller determines that the chopper circuit is in the turned-off state in response to the direction of the current of the first capacitor being detected to be the second direction;

when the input end of the current detection circuit is connected in parallel with the power switch, the controller determines that the chopper circuit is in the turned-on state in response to the direction of the current of the first capacitor being detected to be the second direction, and the controller determines that the chopper circuit is in the turned-off state in response to the direction of the current of the first capacitor being detected to be the first direction; and the first direction is opposite to the second direction.

8. The converter according to claim 7, wherein the signal conditioning circuit converts the first current detection signal or the second current detection signal in a form of an analog signal as received into the operating state signal in a form of a digital signal, and the operating state signal comprises a first signal and a second signal, wherein the first signal corresponds to the first direction, and the second signal corresponds to the second direction.

9. The converter according to claim 1, wherein the current detection circuit further comprises a second resistor; and the isolation circuit comprises:

a first optocoupler device, wherein the first capacitor, an input end of the first optocoupler device and the second resistor are connected in series, and an output end of the first optocoupler device is electrically connected to the signal conditioning circuit; and a second optocoupler device, wherein the first capacitor, an input end of the second optocoupler device and the second resistor are connected in series, an output end of the second optocoupler device is electrically connected to the signal conditioning circuit, a first end of the input end of the second optocoupler device is electrically connected to a second end of the input end of the first optocoupler device, a second end of the input end of the second optocoupler device is electrically connected to a first end of the input end of the first optocoupler device, the first end of the input end of the second optocoupler device has a same polarity as the first end of the input end of the first optocoupler device.

10. The converter according to claim 9, wherein the current detection signal comprises a first current detection signal and a second current detection signal, the first optocoupler device outputs the first current detection signal when the direction of the current of the first capacitor is a first direction, and the second optocoupler device outputs the second current detection signal when the direction of the current of the first capacitor is a second direction.

11. The converter according to claim 10, wherein when the input end of the current detection circuit is connected in parallel with the first resistor, the controller determines that the chopper circuit is in the turned-on state in response to the direction of the current of the first capacitor being detected to be the first direction, and the controller determines that the chopper circuit is in the turned-off state in response to the direction of the current of the first capacitor being detected to be the second direction;

when the input end of the current detection circuit is connected in parallel with the power switch, the controller determines that the chopper circuit is in the turned-on state in response to the direction of the current of the first capacitor being detected to be the second direction, and the controller determines that the chopper circuit is in the turned-off state in response to the direction of the current of the first capacitor being detected to be the first direction; and the first direction is opposite to the second direction.

12. A converter, comprising:

a chopper circuit, comprising a first resistor and a power switch connected in series, wherein the power switch comprises a control end, a first end and a second end;

a first current detection circuit, comprising:

a first capacitor; and a first isolation circuit, wherein an input end of the first isolation circuit is connected in series with the first capacitor; wherein the first current detection circuit is configured to detect a direction of a current flowing through the first capacitor and output a first current detection signal;

a second current detection circuit, comprising:

a second capacitor; and a second isolation circuit, wherein an input end of the second isolation circuit is connected in series with the second capacitor; wherein the second current detection circuit is configured to detect a direction of a current flowing through the second capacitor and output a second current detection signal; and an input end of the first current detection circuit and an input end of the second current detection circuit are connected in parallel to the first resistor, or the input end of the first current detection circuit and the input end of the second current detection circuit are connected in parallel to the power switch;

a signal conditioning circuit, electrically connected to an output end of the first current detection circuit and an output end of the second current detection circuit, wherein the signal conditioning circuit is configured to receive one of the first current detection signal or the second current detection signal, and output an operating state signal of the chopper circuit; and a controller, electrically connected to the signal conditioning circuit, wherein the controller is configured to receive the operating state signal and determine whether the chopper circuit is in a turned-on state or a turned-off state.

13. The converter according to claim 12, wherein when the input end of the first current detection circuit and the input end of the second current detection circuit are connected in parallel with the first resistor, the controller determines that the chopper circuit is in the turned-on state in response to the direction of the current of the first capacitor being detected to be a first direction, and the controller determines that the chopper circuit is in the turned-off state in response to the direction of the current of the second capacitor being detected to be a second direction;

when the input end of the first current detection circuit and the input end of the second current detection circuit are connected in parallel with the power switch respectively, the controller determines that the chopper circuit is in the turned-on state in response to the direction of the current of the second capacitor being detected to be the second direction, and the controller determines that the chopper circuit is in the turned-off state in response to the direction of the current of the first capacitor being detected to be the first direction; and the first direction is opposite to the second direction.

14. The converter according to claim 13, wherein the signal conditioning circuit converts the first current detection signal or the second current detection signal in a form of an analog signal as received into the operating state signal in a form of a digital signal, and the operating state signal comprises a first signal and a second signal, wherein the first signal corresponds to the first direction, and the second signal corresponds to the second direction.

15. The converter according to claim 13, wherein the first current detection circuit further comprises a second resistor connected in series with the first capacitor and the input end of the first isolation circuit; and the first isolation circuit comprises:

a first transformer, wherein a primary side of the first transformer is the input end of the first isolation circuit, and a secondary side of the first transformer is an output end of the first isolation circuit; and a first voltage regulator tube, wherein an anode of the first voltage regulator tube is electrically connected to a first end of the primary side of the first transformer, and a cathode of the first voltage regulator tube is electrically connected to a second end of the primary side of the first transformer;

the second current detection circuit further comprises a third resistor connected in series with the second capacitor and the input end of the second isolation circuit; and the second isolation circuit comprises:

a second transformer, wherein a primary side of the second transformer is the input end of the second isolation circuit, a secondary side of the second transformer is an output end of the second isolation circuit, and a first end of the primary side of the second transformer is a same end as the first end of the primary side of the first transformer; and a second voltage regulator tube, wherein an anode of the second voltage regulator tube is electrically connected to a second end of the primary side of the second transformer, and a cathode of the second voltage regulator tube is electrically connected to the first end of the primary side of the second transformer.

16. The converter according to claim 15, wherein the first transformer outputs the first current detection signal when the direction of the current of the first capacitor is the first direction; and the second transformer outputs the second current detection signal when the direction of the current of the second capacitor is the second direction.

17. The converter according to claim 13, wherein the first current detection circuit further comprises a second resistor connected in series with the first capacitor and the input end of the first isolation circuit;

the first isolation circuit comprises:

a first optocoupler device, wherein an input end of the first optocoupler device is the input end of the first isolation circuit, and an output end of the first optocoupler device is an output end of the first isolation circuit; and a first diode, wherein a cathode of the first diode is electrically connected to a first end of the input end of the first optocoupler device, and an anode of the first diode is electrically connected to a second end of the input end of the first optocoupler device;

the second current detection circuit further comprises a third resistor connected in series with the second capacitor and the input end of the second isolation circuit; and the second isolation circuit comprises:

a second optocoupler device, wherein an input end of the second optocoupler device is the input end of the second isolation circuit, an output end of the second optocoupler device is an output end of the second isolation circuit, a first end of the input end of the second optocoupler device is electrically connected to the second end of the input end of the first optocoupler device, a second end of the input end of the second optocoupler device is electrically connected to the first end of the input end of the first optocoupler device, the first end of the input end of the second optocoupler device has a same polarity as the first end of the input end of the first optocoupler device; and a second diode, wherein an anode of the second diode is electrically connected to the second end of the input end of the second optocoupler device, and a cathode of the second diode is electrically connected to the first end of the input end of the second optocoupler device.

18. The converter according to claim 17, wherein the first optocoupler device outputs the first current detection signal when the direction of the current of the first capacitor is the first direction; and the second optocoupler device outputs the second current detection signal when the direction of the current of the second capacitor is the second direction.

* * * * *